(12) United States Patent
Ehrenberg et al.

(10) Patent No.: US 10,344,377 B1
(45) Date of Patent: *Jul. 9, 2019

(54) STENCIL MASKS FOR MAKING CONFORMABLE ELECTROMAGNETIC DEVICE STRUCTURES

(71) Applicants: Massachusetts Institute of Technology, Cambridge, MA (US); The United States of America, as Represented by the Secretary of the Air Force, Washington, DC (US)

(72) Inventors: Isaac M. Ehrenberg, Brookline, MA (US); Bae-Ian Wu, Beavercreek, OH (US); Sanjay Emani Sarma, Lexington, MA (US)

(73) Assignees: MASSACHUSETTS INSTITUTE OF TECHNOLOGY, Cambridge, MA (US); THE UNITED STATES OF AMERICA, AS REPRESENTED BY THE SECRETARY OF THE AIR FORCE, Washington, DC (US)

( * ) Notice: Subject to any disclaimer, the term of this patent is extended or adjusted under 35 U.S.C. 154(b) by 123 days.

This patent is subject to a terminal disclaimer.

(21) Appl. No.: 15/478,509

(22) Filed: Apr. 4, 2017

Related U.S. Application Data

(63) Continuation of application No. 14/325,351, filed on Jul. 7, 2014, now Pat. No. 9,656,290.

(60) Provisional application No. 61/843,127, filed on Jul. 5, 2013.

(51) Int. Cl.
| | | |
|---|---|---|
| *B05D 1/32* | (2006.01) | |
| *B05D 7/00* | (2006.01) | |
| *B05C 21/00* | (2006.01) | |
| *C23C 14/04* | (2006.01) | |
| *C23C 16/04* | (2006.01) | |

(52) U.S. Cl.
CPC .......... *C23C 16/042* (2013.01); *B05C 21/005* (2013.01); *B05D 1/32* (2013.01); *B05D 7/50* (2013.01); *C23C 14/042* (2013.01)

(58) Field of Classification Search
None
See application file for complete search history.

(56) References Cited

U.S. PATENT DOCUMENTS

| | | | |
|---|---|---|---|
| 3,724,420 A | 4/1973 | Quinn | |
| 2008/0028956 A1* | 2/2008 | Sedberry | H01Q 1/42 101/129 |
| 2008/0047444 A1* | 2/2008 | Fields | B44D 2/002 101/127 |
| 2010/0258014 A1 | 10/2010 | van Heijningen | |
| 2010/0260938 A1* | 10/2010 | Kondo | C23C 14/042 427/282 |
| 2011/0226143 A1* | 9/2011 | Cudworth | B05C 17/06 101/127 |

OTHER PUBLICATIONS

Kim, Gyuman, et al., Photoplastic shadow-masks for rapid resistless multi-layer micropatterning, Transducers 01, The 11th International Conference on Solid-State Sensors and Actuators, Munich, Germany, Jun. 10-14, 2001, 4 pages.

* cited by examiner

*Primary Examiner* — William P Fletcher, III
(74) *Attorney, Agent, or Firm* — Nutter McClennen & Fish LLP

(57) ABSTRACT

Methods of forming shaped structures on a surface are provided. The methods utilize 3D stencils in conjunction with depositing material(s) on a surface. The surface can be non-planar. In some exemplary embodiments, a method of forming a shaped structure on a surface includes placing a 3D stencil onto a non-planar surface such that a non-planar facing side of the stencil conformally covers the non-planar surface, and depositing a material onto the non-planar surface over which the 3D stencil is placed. The deposited material becomes the shaped structure that has at least a layer facing the non-planar surface that conforms to such surface. At least the non-planar facing side of the stencil maintains the shape that is congruent with the non-planar surface when no force is applied to both the non-planar facing side and an opposed opposing side of the stencil. Stencils, stencil masks, kits, and other methods are also provided.

16 Claims, 5 Drawing Sheets

US 10,344,377 B1

STENCIL MASKS FOR MAKING CONFORMABLE ELECTROMAGNETIC DEVICE STRUCTURES

CROSS REFERENCE TO RELATED PATENT APPLICATIONS

The present application is a continuation of U.S. application Ser. No. 14/325,351 filed Jul. 7, 2014, and titled "Stencil Masks for Making Conformable Electromagnetic Device Structures," now U.S. Pat. No. 9,656,290 B1, from which priority under 35 U.S.C. § 120 is claimed. The present application also claims priority under 35 U.S.C. § 119(e) from U.S. provisional application 61/843,127, filed Jul. 5, 2013, and titled "Method for Fabricating Conformable Electromagnetic Structures and Devices." The invention descriptions contained in those applications are incorporated by reference into this description.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to electromagnetic devices that can be conformably applied to non-planar surfaces, and more specifically to masks and stencils for applying conforming electromagnetic device structures to non-planar surfaces by selective metallization methods such as vacuum deposition and electrochemical coating.

Prior art approaches for making, for example, conformal antenna arrays on non-planar, often double-curved, airborne surfaces include multiple layers and tiles of printed circuit board (PCB) elements; and, PCB elements on flexible substrates.

Both approaches require intricate and time-consuming assembly steps, and introduce unwanted artifacts from applying primarily flat components to curved surfaces.

Direct patterning of electromagnetic devices on cylindrical or single curved surfaces has been accomplished by directive deposition through shadow masks and flexible contact masks.

Fully conformable electromagnetic devices have been made using direct writing processes in which robotic styluses seamlessly deposit thin layers of metallic ink. This approach can make fine line widths for precisely selective metallization, but is limited by the serial nature of the process and the physical and electrical properties of conductive ink.

There is, therefore, a need for better methods for making conformable electromagnetic structures.

There is a further need for optimized parameters for such conformable electromagnetic structures.

SUMMARY OF THE INVENTION

The complexities and limitations of the prior are overcome by a new 3D stencil mask that allows simple stenciling of electromagnetic device structures onto non-planar surfaces.

The 3D stencil mask includes islands and bridges from prior art two-dimensional lettering stencils, but raises the islands and stencils above the side of the 3D stencil mask facing a non-planar surface, forming undercuts, so that material particles, such as from vacuum metal deposition, will form connected shapes. The 3D stencil mask is also configured so that the dimensions of the resulting electromagnetic structures are altered from a simple projected image of a structure designed for a planar surface so that the electromagnetic properties of the deposited structure are more nearly the same as those of a corresponding structure on a planar surface.

BRIEF DESCRIPTION OF THE DRAWINGS

The teachings of the present invention will be better understood from the following drawings illustrating various aspects and example embodiments of the invention and its teachings.

DETAILED DESCRIPTION

Figure 1:
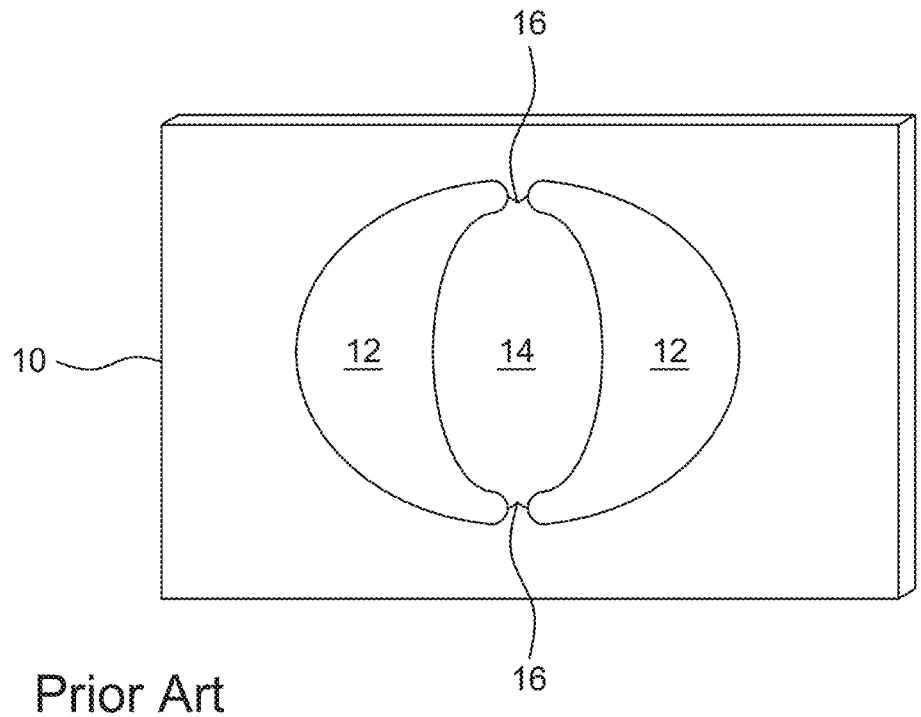
FIG. 1 shows a very simplified view of an example prior art stencil for the letter "O.
Figure 6:
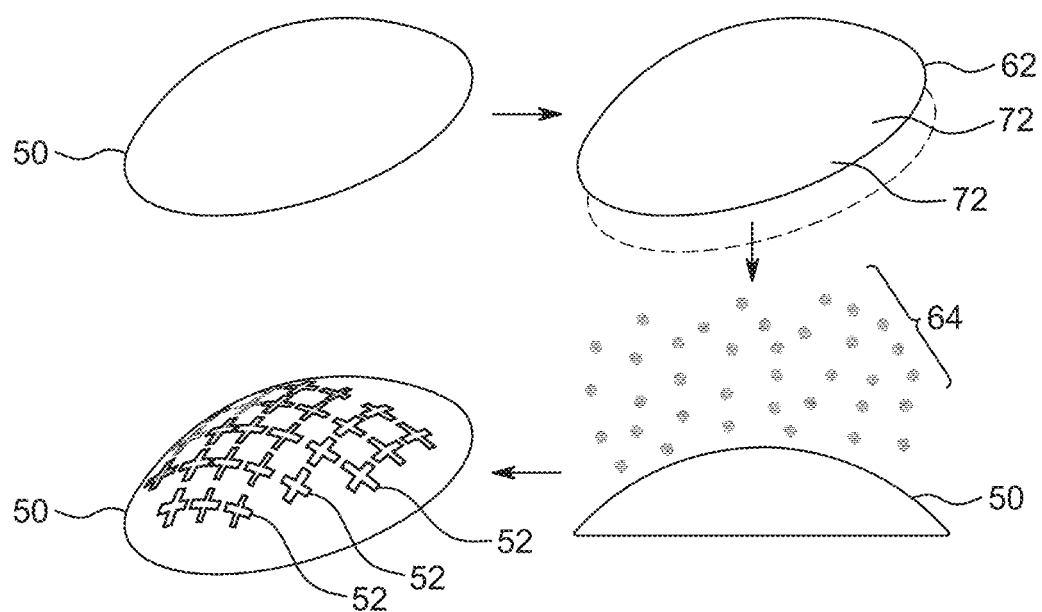
FIG. 6 shows an example embodiment of a 3D mask according to the teachings of the present invention used to direct or guide deposition of a pattern of stop or band pass filters onto a non-planar surface.
Figure 7:
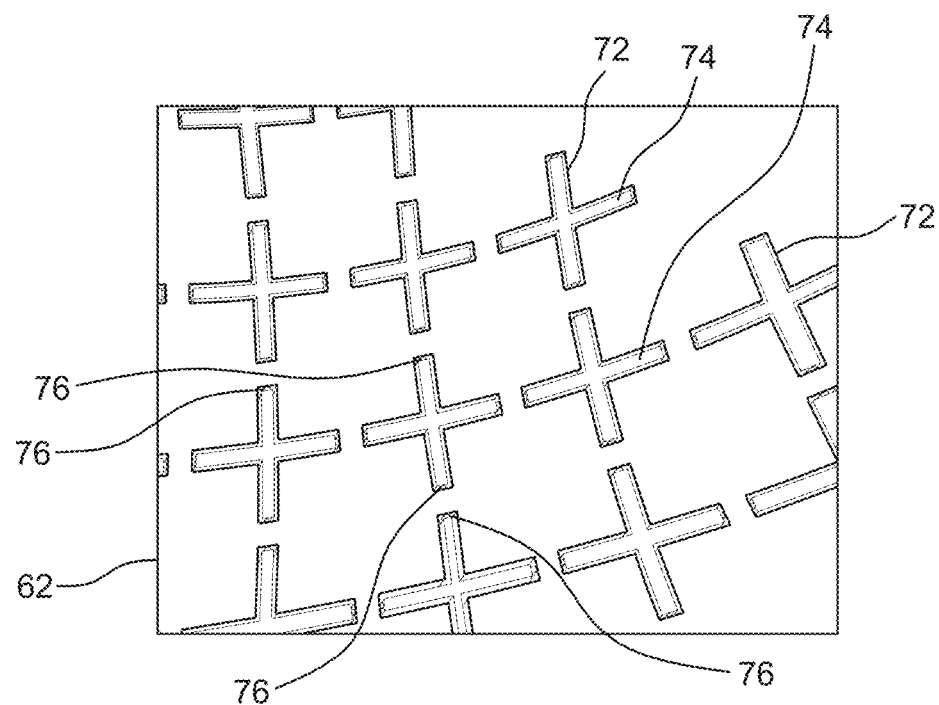
FIG. 7 shows a portion of the underside of the 3D mask of FIG. 6.
Figure 8:
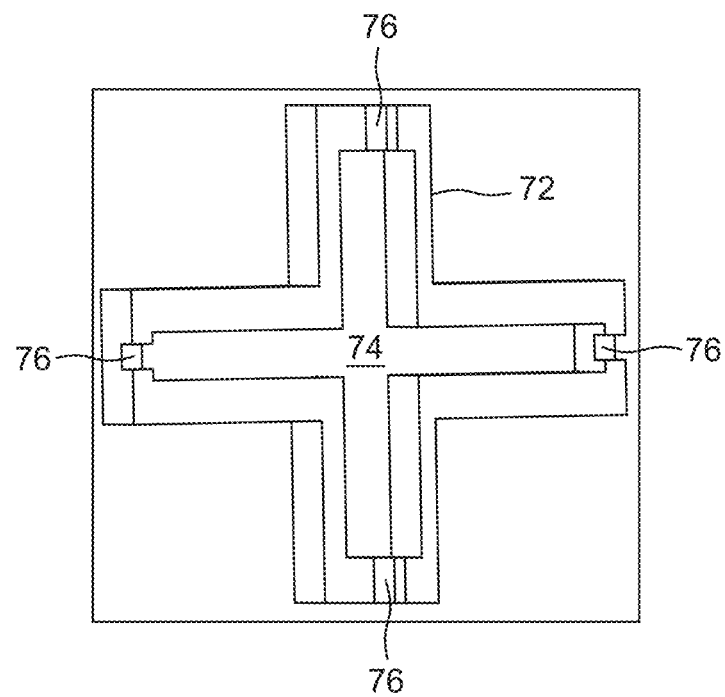
FIG. 8 shows an example mask element of the 3D mask of FIGS. 5, 6 and 7.

FIG. 1 shows a very simplified view of an example prior art stencil 10 for the letter "O." A prior art stencil will usually include many more characters, as shown, for example, in the example stencil print shown in the referenced provisional application. FIGS. 1-4 are highly simplified to more clearly illustrate some of the key teachings of the present invention which are otherwise often difficult to grasp when viewing only more practical example embodiments as shown in FIGS. 6-8.

A stencil character that includes a void, or voids, 12, such as an "O," is typically made by including an island 14 connected to the rest of stencil 10 by bridges 16. Otherwise, obviously, islands, such as island 14, would not remain connected to the rest of stencil 10.

Figure 2:
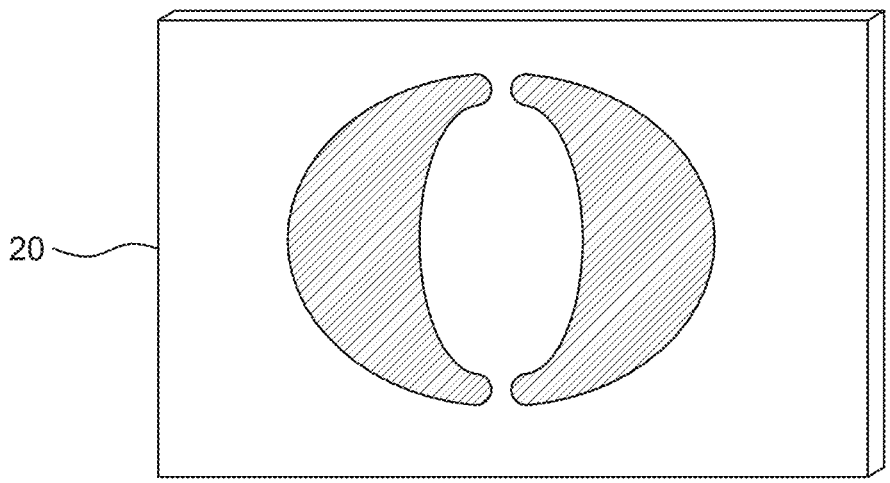
" FIG. 2 shows the letter "O" as made using the stencil of FIG. 1.

Such islands and bridges result in the familiar disconnected lettering as shown in the letter "O" printed on a sheet of paper 20 shown in FIG. 2.

While such disconnected characters are not a problem for lettering, they are a problem for using stencils, or masks, to guide or direct deposition of electromagnetic materials onto surfaces where continuous metal layers are required for electromagnetic device structures to work.

Figure 3:
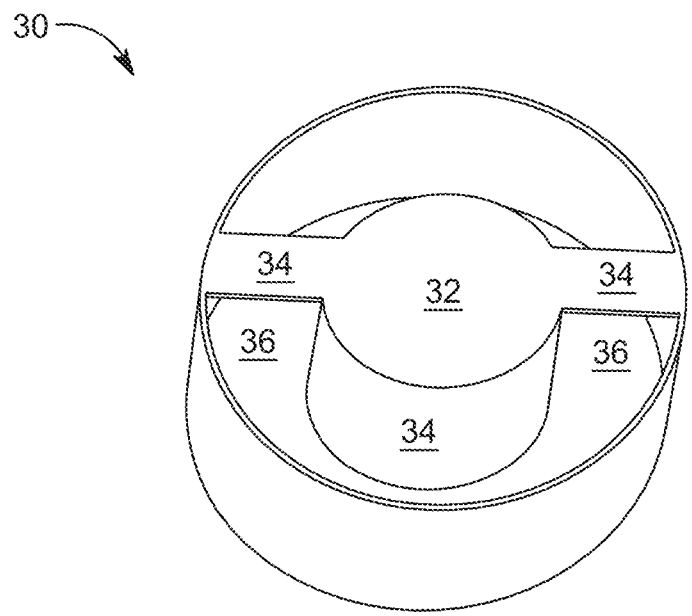
FIG. 3 shows a very simplified example embodiment of a 3D stencil according to the teachings of the present invention for making the letter "O".
Figure 4:
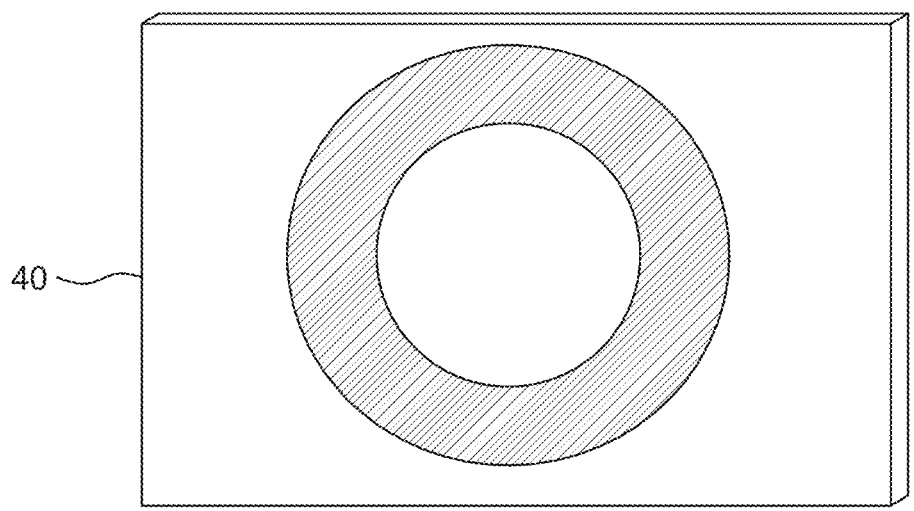
FIG. 4 shows the letter "O" made using the 3D stencil of FIG. 1.

FIG. 3 shows a very simplified example embodiment of a 3D stencil 30 according to the teachings of the present invention for making a continuous letter "O" as shown in FIG. 4.

FIG. 4 shows the letter "O" as made on a sheet of paper 40 using 3D stencil 30.

3D stencil 30 includes an island 32 and bridges 34, but only along the top, or opposing side, of 3D stencil 30. The outline, or shape, of island 32 extends through wall 34 to the bottom, or facing paper side, of 3D stencil 30, but without bridges. An undercut 36 is thus created below the conventional stencil outline at the top of 3D stencil 30 so that, when a spray of ink, or other, particles is passed through 3D stencil 30, a fully connected letter "O" is formed on sheet of paper 40.

Figure 5:
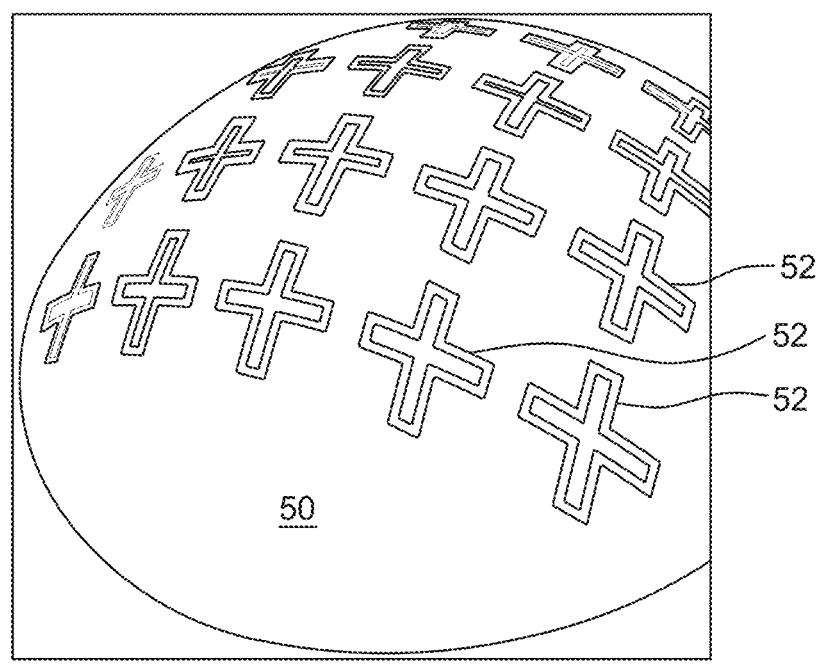
FIG. 5 shows an example pattern of stop or band pass filters on a non-planar curvilinear surface.

FIG. 5 shows a non-planar curvilinear surface 50, as might be the outer surface of an aircraft. A key object of the present invention is being able to deposit, in this example embodiment, a pattern of electromagnetic devices, such as stop or band pass filters 52 on non-planar curvilinear surface 50, typically as a metal layer.

FIG. 6 shows an example embodiment of a 3D mask 62, made according to the teachings of the present invention, used to guide or direct deposition of a pattern of stop or band pass filters 64 onto non-planar surface 50.

In the sequence of steps shown in FIG. 6, a 3D mask, or 3D stencil mask, 62 is placed over non-planar surface 50 and vacuum, or other conventional, deposition is used to deliver metal particles 64 through openings, or stencil elements, 72 in 3D mask 62 to deposit continuous stop or band pass filters 52 onto non-planar surface 50.

FIG. 7 shows a portion of the underside of 3D mask 62. As seen in FIG. 7, and as better understood from the teachings of the present invention as described in relation to FIGS. 3 and 4, each mask or stencil element 72 includes an island 74 connected to the rest of 3D mask 62 by bridges 76. Bridges 76 are connected to the rest of 3D mask 62 only above where the bottom of 3D mask 62 contacts non-planar surface 50, providing undercuts similar to as described in relation to FIG. 3.

FIG. 8 shows the underside of a single example mask or stencil element 72 of 3D mask 62, more clearly showing an island 74 and bridges 76 connecting island 74 only above the bottom of stencil element 72.

Island 74 is more clearly seen, and understood, by viewing it as facing toward the viewer's left.

Key to realizing conformal or conformed antenna arrays according to the teachings of the present invention is use of rapid prototyping, such as 3D printing, to produce not only a non-planar substrate, but also a 3D conformal mask to enable selective metallization of the substrate surface. Such 3D masks can be generated from the same equations that create an original non-planar substrate minus a projection of a finalized antenna array to enable selective metallization of the substrate surface.

While so-called "rapid" prototyping, such as 3D printing, is only "rapid" when compared to traditional machining, so that using 3D printing to deposit electromagnetic device structures directly onto non-planar surfaces would be very slow, stencil masks as described here, once made using rapid prototyping allows much faster fabrication of such electromagnetic device structures onto non-planar surfaces.

Metallization itself can be achieved using one of many available vacuum deposition and electrochemical methods. Vacuum deposition includes several low-pressure processes such as thermal evaporation, where solid metal pieces are vaporized by large currents running through tungsten electrodes, E-beam evaporation, where high energy electrons are used to melt and evaporate a desired material, and sputtering, where metal particles are knocked loose from a target by high energy ions. All three processes result in direct metallization as metal particles embed themselves within and form a film on top of any exposed surface on the substrate.

Several factors to consider when using vacuum metallization include deposition rate, which may only be microns per hour, maximum attainable film thickness due to delamination caused by residual stress, and thermal properties of the substrate and mask. Thermal properties of substrate materials are important given the energy dissipated as fast moving particles encounter the substrate and mask surface. Heat accumulation can be significant as both conductive and convective heat transfer is limited within a vacuum chamber. While elevated temperatures can induce melting and release stresses that cause mask or substrate deformation, such damage can be prevented by using plastics with higher deflection temperatures, or thicker masks and substrates to increase thermal mass.

Other important factors are substrate surface roughness and thin film material properties. Though the process of vacuum metallization can deposit pure metals, thin metal films on rough surfaces may yield higher resistances than films on smooth surfaces or bulk material. To the naked eye, a coating of one micron may appear complete and conformal, but resistance measurements indicate the conductivity of the coated surface is well below that of a solid metal sheet. Deposition of additional layers reduces sheet resistance, but can take some time to reach bulk conductivity levels. Increased film thickness increases likelihood of delamination, but surface roughness will mitigate the peeling factor.

Electrochemical coating methods such as electroplating or electroforming can also be used for metallization of substrates, although an adhesion promoting basecoat or surface chemistry treatment is often required. A 3D conformal mask according to the teachings of the present invention is used to ensure metallization is selective during an initial seeding step, which may involve conductive paint or a vacuum deposited pattern, followed by plating or electroforming. Despite additional process steps, electrochemical methods can rapidly produce relatively thick metal layers with improved structural and electrical properties compared to vacuum deposited films. Electrochemical coating processes that require an applied potential difference are ideally suited only for continuous topological structures, such as an array of patch antenna elements as described with regard to FIGS. 9(a)-(f), necessitating only a few conductive connections to facilitate coating of the entire geometry. Discontinuous designs, such as Frequency Selective Surface arrays, will require an electroless plating process in place of direct deposition.

While the desired result is fabrication of a conformal antenna array, the design process begins with a combination of the same analytical and numerical approaches commonly used to design and analyze canonical antenna elements and arrays. For such planar or simply curved elements, initial design criteria can be obtained through physics-based first principle models or more intricate formulations. These analytic or quasi-analytic methods yield preliminary radiation characteristics of the elements and overall array, which can then be extended and applied to the conformal antenna shape. As the complexity of the non-planar surface makes analytical tools more difficult to synthesize and less accurate, numerical analysis and full wave simulations are conducted to provide high accuracy results of conformal designs. Full wave simulation also represents an avenue towards optimization of antenna and array parameters to reach performance goals within geometric and fabrication constraints, some of which will be highlighted in the FIGS.

9(a)-(f) fabrication example. Graphical representations of complex surfaces lead directly to the design and fabrication of any required masking elements, which are then utilized for surface patterning with available coating methods, be they additive or the subtractive processes. By following this framework, sample material was measured to be 2.86 with a loss tangent bounded by 0.02.

FIGS. 9(a)-(f) shows a more advanced application of the teachings of the present invention so that the performance of a conformed electromagnetic device will more closely match the performance of a similar electromagnetic device on a plane surface.

A doubly curved surface 92 composed from a combination of Gaussian and sinusoidal functions was designed for implementing a conformal or conformed antenna array, where z(x, y) is defined by:

$$z(x, y) = A\sin\left(\frac{\pi}{l}x\right)\sin\left(\frac{\pi}{l}y\right) \sum_{n=0}^{4}\frac{1}{2}A_n e^{\frac{-(x-x_n)^2+(y-y_n)^2}{2\sigma^2}} \quad (1)$$

where σ=10 mm, $(x_n, Y_n)$ are the center coordinates of the Gaussians, l is the center-to-center distance for a square array, amplitude A is 10 mm and $A_n$ either 10 mm or −10 mm. To form a 3D substrate, the surface was thickened to 1.73 mm.

A non-planar substrate 92, as well as other planar substrates and masks, were fabricated with an Objet Connex 500 3D printer and photopolymer (VEROWHITE+) cured by exposure to ultraviolet light.

Before designing a conformal antenna array for non-planar substrate 92, a planar array 94 of four patch antenna elements 96 was designed for a planar substrate 93 with a footprint of 100 cm and thickness of 1.73 mm.

The dimension of each element 96 was 21.5 mm and included inset notches for tuning each patch to resonate near 4 GHz, verified by numerical simulations. The four patches 96 fit within an 87.25 mm×87.25 mm area, and the center-to-center distance between neighboring patches was 66 mm, allowing for the width of two elements between patches. Parameters for the planar array's main feed line 98 and secondary feed lines 100 were calculated using stripline impedance formulas, also verified with simulations. The thickness of initial feed line 98 was tuned to an impedance of 71Ω, which fed two 100Ω secondary feed lines 100 before splitting into individual antenna elements with 50Ω inputs 102. Return loss of this planar implementation was below −10 dB at 4 GHz, where the radiation pattern was directed along an axis normal to the plane of the antenna with a maximum realized gain of 9 dB, shown as 104 in FIG. 9(b).

Figure 9A:
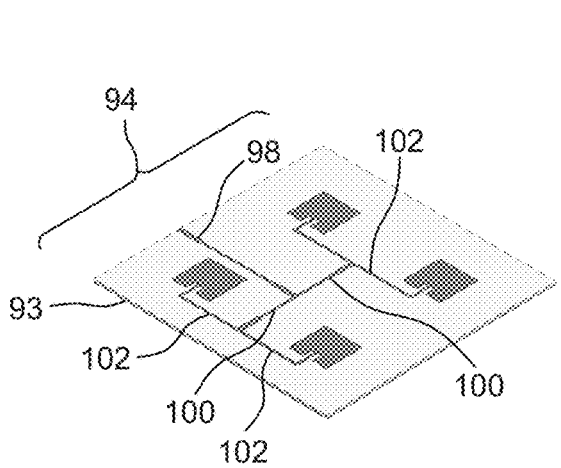
FIGS. 9(a)-(f) show the results of varying the dimensions of a 30 mask according to the teachings of the present invention so that the performance of a conformed electromagnetic device made using that 3D mask more closely matches the performance of a similar electromagnetic device on a plane surface.
Figure 9B:
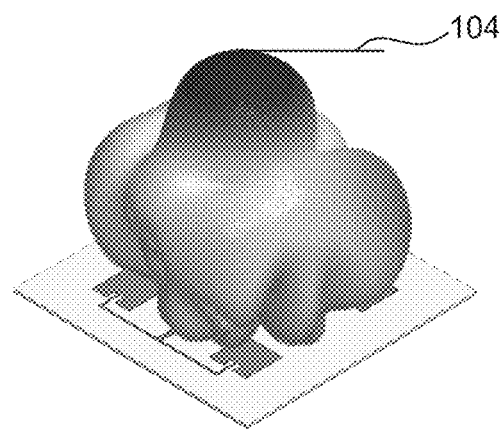
Figure 9C:
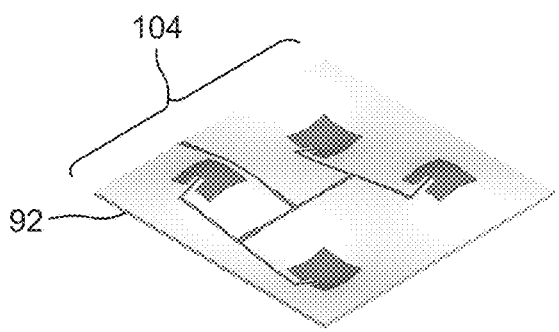
Figure 9D:
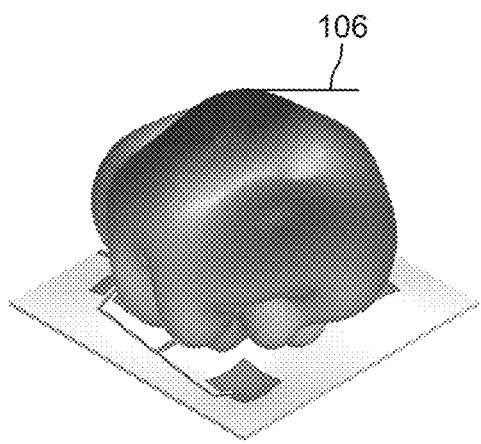
Figure 9E:
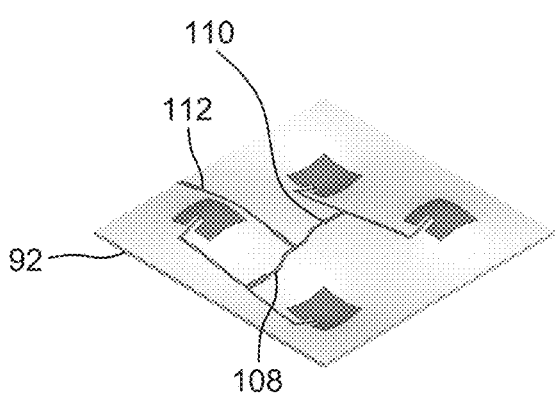
Figure 9F:
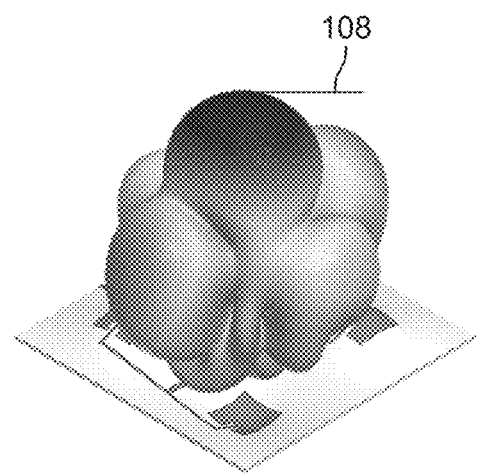

With planar array design 94 complete, a model of a conformal antenna array 104 was generated by projecting planar array model 94 onto non-planar substrate surface 92 such that each antenna element was centered on one of the maxima or minima of the non-planar substrate. Though a simulation of the unaltered projection onto the curved surface predicted only a slightly altered return loss near 4 GHz, the new geometry resulted in a significant degradation in antenna gain 106 and alteration of the antenna pattern as shown in FIG. 9(d).

To counter the performance decrease that accompanied the transformation to non-planarity, several design changes were introduced. First, a parameter sweep was performed that revealed patch dimensions elongated during projection onto the non-planar substrate, resulting in a shift in patch resonance frequency. The change for convex patches was minimal, but the shift for concave antenna patches was significant enough so that the patch dimensions were shortened slightly to 21 mm×21 mm, which recentered their resonance at 4 GHz. While this change drastically improved return loss, it did not improve realized gain, which was caused by the height difference between the convex and concave antenna patches. At a difference of 20 mm, the phase of radiated waves was shifted such that it significantly broadened the array's radiation pattern. To compensate, secondary feed lines 108 and 110 were made asymmetric to account for the extra distance and enable maximum gain while in the conformal array configuration. It was also found that main feed line 112 should be put on the convex side as shown instead of the concave side to minimize undesired coupling between the nearby patch and the feedline. Together, these changes increased the overall antenna array gain to 9.5 dB as shown at 108.

The teachings of the present invention will provide precise, economical and rapid selective metallization onto substrates, primarily for forming electromagnetic device structures, but can be easily extended to a wide range of other uses.

For example, the teachings of the present invention have been used for putting electromagnetics circuit components, such as capacitors, resistors, amplifiers and phase shifters, conformably onto substrates. The teachings of the present invention allow selective deposition of materials (metal and other materials) on arbitrary surfaces for propagation (transmission lines and circuit components), for scattering and for radiation on arbitrary surfaces.

Various other modifications to the invention as described may be made, as might occur to one with skill in the art of the invention, within the scope of the claims. Therefore, not all contemplated example embodiments have been shown in complete detail. Other embodiments may be developed without departing from the spirit of the invention or from the scope of the claims.

We claim:

1. A method of forming a shaped structure on a surface, comprising:
    placing a facing side of a 3D stencil having a non-planar facing side onto a non-planar surface having a shape that is congruent with a shape of the non-planar facing side such that the non-planar facing side conformally covers the non-planar surface onto which a material for forming a shaped structure is to be deposited; and
    depositing a material onto the non-planar surface over which the 3D stencil is placed such that the material becomes the shaped structure, the shaped structure having at least a layer facing the non-planar surface that conforms to the non-planar surface,
    wherein at least the non-planar facing side of the 3D stencil maintains the shape that is congruent with the non-planar surface when no force is applied to both the non-planar facing side and an opposed opposing side of the 3D stencil.

2. The method of claim 1, wherein the shaped structure is a shaped electromagnetic element.

3. The method of claim 1, wherein the shaped structure includes one or more electromagnetic elements including one or more of (i) one or more antenna elements, (ii) one or more Frequency Selective Surface arrays elements, and (iii) one or more feed lines.

4. The method of claim 1, wherein depositing a material onto the non-planar surface further comprises performing selective metallization of the non-planar surface using at least one of a vacuum deposition method and an electrochemical coating method.

5. The method of claim 4, wherein the vacuum deposition method is selected from the group consisting of thermal evaporation, e-beam evaporation, and sputtering.

6. The method of claim 4,
wherein the at least one of a vacuum deposition method and an electrochemical coating method causes the temperature of the 3D stencil to be raised, and
wherein the shape of the non-planar facing side of the 3D stencil is unchanged by the raising of the temperature of the 3D stencil.

7. The method of claim 1, wherein the geometry of the non-planar facing side of the 3D stencil is the same as the geometry of the non-planar surface over which the 3D stencil is placed.

8. The method of claim 1, wherein placing a facing side of the 3D stencil having a non-planar facing surface onto a non-planar surface causes the non-planar facing side of the 3D stencil to be in contact with the portion of the non-planar surface that is conformally covered.

9. The method of claim 1, further comprising fabricating the 3D stencil and the non-planar surface using a same set of equations that create an original non-planar surface minus a projection of a finalized antenna array.

10. The method of claim 9, wherein fabricating the 3D stencil comprises:
identifying a planar model of the shaped structure;
projecting the planar model of the shaped structure onto the non-planar surface; and
generating the 3D stencil by omitting, from the 3D stencil, a shape matching the planar model of the shaped structure as projected onto the non-planar surface.

11. The method of claim 10, wherein fabricating the 3D stencil and the non-planar surface is performed using additive manufacturing or rapid prototyping.

12. The method of claim 11, wherein fabricating the 3D stencil is performed simultaneously with fabricating the non-planar surface.

13. The method of claim 1, wherein the 3D stencil further comprises:
a facing side opening representing part of the shaped structure;
the opposing side facing away from the facing side, the opposing side including:
an opposing side opening representing part of the shaped structure;
an opposing side island representing part of the shaped structure, the opposing and side island including walls extending from at least the opposing side to the facing side forming a bottom island representing part of the shaped structure.

14. A method of forming a shaped structure on a surface, comprising:
placing a facing side of a 3D stencil having a non-planar facing side onto a non-planar surface having a shape that is congruent with a shape of the non-planar facing side such that the non-planar facing side conformally covers the non-planar surface onto which a plurality of materials for forming a shaped structure are to be deposited;
depositing a first material onto the non-planar surface over which the 3D stencil is placed such that the first material conforms to the non-planar surface; and
depositing a second material onto the non-planar surface over which the first material was deposited, such that the first material and the second material becomes the shaped structure, the shaped structure having at least a layer facing the non-planar surface that conforms to the non-planar surface,
wherein at least the non-planar facing side of the 3D stencil maintains the shape that is congruent with the non-planar surface when no force is applied to both the non-planar facing side and an opposed opposing side of the 3D stencil.

15. The method of claim 14, wherein, prior to depositing a second material onto the non-planar surface, the 3D stencil is removed from contact with the non-planar surface.

16. The method of claim 15, wherein the second material comprises a metal.

* * * * *